(12) United States Patent
Su

(10) Patent No.: US 8,124,458 B2
(45) Date of Patent: Feb. 28, 2012

(54) METHOD FOR PACKAGING SEMICONDUCTOR DIES HAVING THROUGH-SILICON VIAS

(75) Inventor: Chao-Yuan Su, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 12/883,910

(22) Filed: Sep. 16, 2010

(65) Prior Publication Data

US 2011/0014749 A1 Jan. 20, 2011

Related U.S. Application Data

(62) Division of application No. 11/778,511, filed on Jul. 16, 2007, now Pat. No. 7,825,517.

(51) Int. Cl.
*H01L 21/00* (2006.01)
(52) U.S. Cl. . 438/118; 438/108; 438/114; 257/E21.503; 257/774; 257/777
(58) Field of Classification Search ............. 257/E23.18, 257/E23.181, E21.503, E21.511, 668, 679, 257/685, 686, 698, 774, 777; 438/106, 108, 438/109, 114, 118; 428/332, 343
See application file for complete search history.

(56) References Cited

U.S. PATENT DOCUMENTS

| | | | | |
|---|---|---|---|---|
| 6,007,920 A * | 12/1999 | Umehara et al. | ........... | 428/473.5 |
| 6,338,195 B1 * | 1/2002 | Tsukagoshi et al. | ............ | 29/832 |
| 6,429,096 B1 | 8/2002 | Yanagida | | |
| 6,667,542 B2 * | 12/2003 | Yamaguchi et al. | .......... | 257/668 |
| 6,730,542 B2 * | 5/2004 | Wang et al. | .................... | 438/108 |
| 6,784,022 B2 * | 8/2004 | Umehara et al. | .............. | 438/111 |
| 6,794,751 B2 | 9/2004 | Kumamoto | | |
| 6,896,760 B1 * | 5/2005 | Connell et al. | ................ | 156/249 |
| 6,919,262 B2 * | 7/2005 | Senoo et al. | .................. | 438/464 |
| 6,943,061 B1 * | 9/2005 | Sirinorakul et al. | .......... | 438/113 |
| 7,071,572 B2 * | 7/2006 | Kumamoto | ................... | 257/778 |
| 7,098,076 B2 | 8/2006 | Liu | | |
| 7,169,648 B2 | 1/2007 | Sato et al. | | |
| 7,279,776 B2 | 10/2007 | Morimoto | | |
| 7,301,222 B1 * | 11/2007 | Patwardhan et al. | ......... | 257/620 |
| 7,445,963 B2 * | 11/2008 | Ho et al. | ....................... | 438/113 |
| 7,537,959 B2 | 5/2009 | Lee et al. | | |
| 7,588,964 B2 | 9/2009 | Kwon et al. | | |
| 7,811,920 B2 * | 10/2010 | Matsui | .......................... | 438/612 |
| 2007/0158787 A1 | 7/2007 | Chanchani | | |
| 2008/0142958 A1 * | 6/2008 | Chen et al. | .................... | 257/723 |

FOREIGN PATENT DOCUMENTS

| CN | 1591884 | 3/2005 |
|---|---|---|
| CN | 1937216 | 3/2007 |
| JP | 2006-12737 | 1/2006 |

* cited by examiner

*Primary Examiner* — Chris Chu
(74) *Attorney, Agent, or Firm* — Slater & Matsil, L.L.P.

(57) ABSTRACT

An integrated circuit structure is provided. The integrated circuit structure includes a die and an anisotropic conducing film (ACF) adjoining the back surface of the die. The die includes a front surface; a back surface on an opposite side of the die than the front surface; and a through-silicon via (TSV) exposed through the back surface of the die.

20 Claims, 11 Drawing Sheets

METHOD FOR PACKAGING SEMICONDUCTOR DIES HAVING THROUGH-SILICON VIAS

This application is a divisional of and claims the benefit of U.S. patent application Ser. No. 11/778,511, filed on Jul. 16, 2007, entitled "Method for Packaging Semiconductor Dies Having Through-Silicon Vias," which application is hereby incorporated herein in its entirety by reference.

TECHNICAL FIELD

This invention relates generally to integrated circuits, and more particularly to the packaging of semiconductor dies, and even more particularly to the packaging of semiconductor dies having through-silicon vias.

BACKGROUND

Through-silicon vias (TSV), also commonly referred to as through-wafer vias (TWV), are widely used in integrated circuits. TSVs can be used for stacking dies. In stacked dies including a first die stacked on a second die, electrical connections may be made from the first die to the top surface of the second die through TSVs in the first die. TSVs are also commonly used for providing a quick and low-resistive path from a front surface of a die to its back surface.

FIGS. 1 through 3 illustrate cross-sectional views of intermediate stages in a conventional process for forming TSVs in a die and grounding the die through the TSVs. Referring to FIG. 1, TSVs 12 are formed in die 10, and extend from substantially the front surface (the top surface) of die 10 into substrate 14, which are typically formed of silicon. TSVs 12 may be used to provide a grounding path for integrated circuit in die 10. Due to process variations, TSVs 12 may have different lengths L.

In FIG. 2, the back surface of die 10 is polished using a slurry that attacks silicon. To ensure all TSVs 12 are exposed through the back surface, silicon substrate 14 may have to be polished to a level so that at least some of the TSVs 12 slightly protrude out of the back surface. Due to the different lengths L of TSVs 12, some of the TSVs 12 will protrude more than others.

In FIG. 3, die 10 is mounted on substrate 16, which may be a lead-frame or other types of package substrates, through silver paste 18. Typically, silver paste 18 is in liquid form, and is applied on substrate 16, followed by pressing die 10 against silver paste 18. Silver paste 18 is conductive, and hence electrically interconnecting TSVs 12. Die 10 is thus grounded through TSVs 12. Since TSVs 12 may protrude out of the back surface of die 12 for different lengths L, die 10 may be tilted. This causes reliability issues. For example, after the formation of wire bonds, molding compound 20 will be applied. Due to the tilting of die 10, some portion of the wire bonds, for example, wire 22, may not be fully covered by molding compound 20, and hence is subject to mechanical damage.

One way to solve the above-discussed problem is to polish back the protruded TSVs 12 after the polishing of silicon substrate 14. However, since TSVs 12, which are typically formed of copper, need different slurries than silicon substrate 14, an additional polishing process is needed. Further, the process for polishing copper is more costly than polishing silicon due to contamination issues. Therefore, polishing back TSVs is a undesirable solution. Accordingly, new methods for packaging dies on substrates without causing the above-discussed problem are needed.

SUMMARY OF THE INVENTION

In accordance with one aspect of the present invention, an integrated circuit structure is provided. The integrated circuit structure includes a die and an anisotropic conducing film (ACF) adjoins the back surface of the die. The die includes a front surface; a back surface on an opposite side of the die than the front surface; and a through-silicon via (TSV) exposed through the back surface of the die.

In accordance with another aspect of the present invention, an integrated wafer-mount tape includes a ultra-violet wafer-mount tape; and an ACF on an opposite side of the integrated wafer-mount tape than the ultra-violet wafer-mount tape.

In accordance with yet another aspect of the present invention, a method for forming a package structure includes providing a die, which includes a front surface; a back surface on an opposite side of the front surface; and a TSV exposed through the back surface of the die. The method further includes attaching an ACF to the back surface of the die, wherein the TSV penetrates into the ACF.

In accordance with yet another aspect of the present invention, a method of forming a package structure includes providing a semiconductor wafer; and providing an integrated wafer-mount tape, which includes an ultra-violet wafer-mount tape; and an ACF on an opposite side of the integrated wafer-mount tape than the ultra-violet wafer-mount tape. The method further includes attaching the semiconductor wafer to the integrated wafer-mount tape, wherein a back surface of the wafer is in contact with the ACF; sawing the semiconductor wafer to separate dies in the semiconductor wafer; exposing the ultra-violet wafer-mount tape to an ultra-violet light; detaching the ultra-violet wafer-mount tape from the ACF; and mounting a die separated from the semiconductor wafer onto a package substrate, wherein the ACF is between the die and the package substrate.

By using the ACF as the electrical interconnection layer, the difference in the protruding lengths of TSVs are absorbed, and the die may be parallel to the respective package substrate after packaging.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel packaging structure and the methods for forming the same are provided. The intermediate stages of manufacturing embodiments of the present invention are illustrated. Throughout the various views and illustrative embodiments of the present invention, like reference numbers are used to designate like elements.

Figure 1:
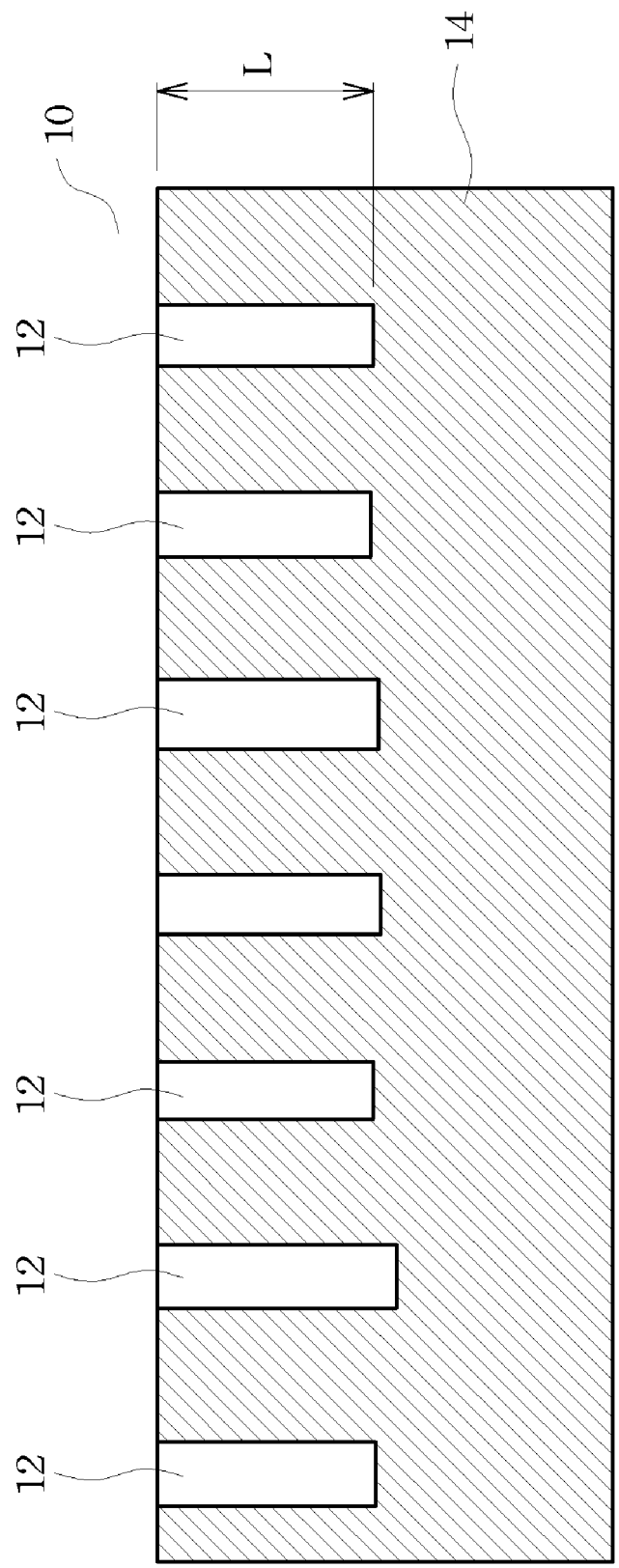
FIG. 1 through 3 are cross-sectional views of intermediate stages in the conventional manufacturing and packaging of a semiconductor die.
Figure 2:
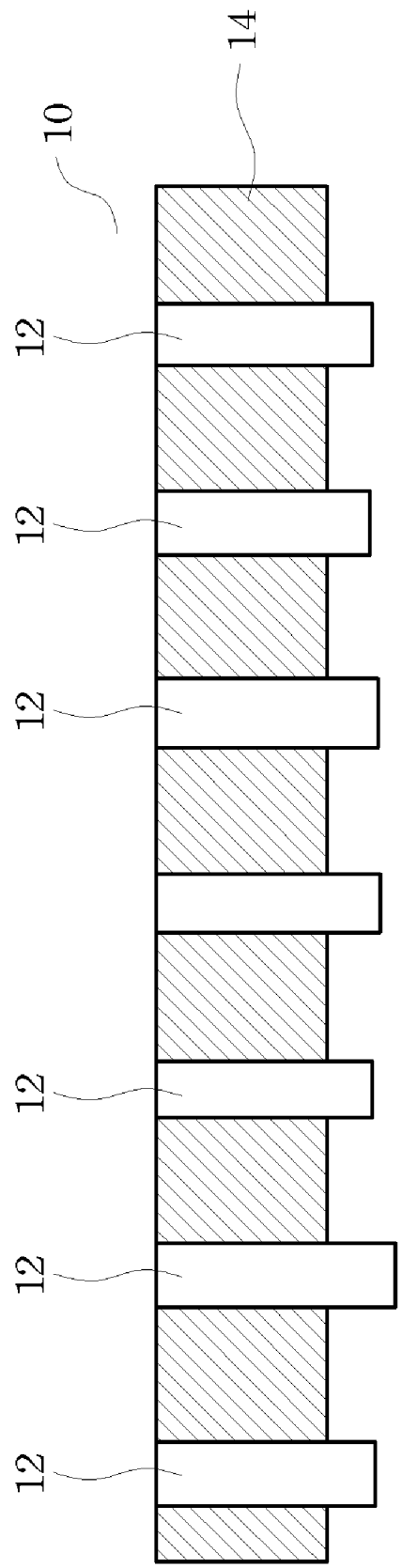
Figure 3:
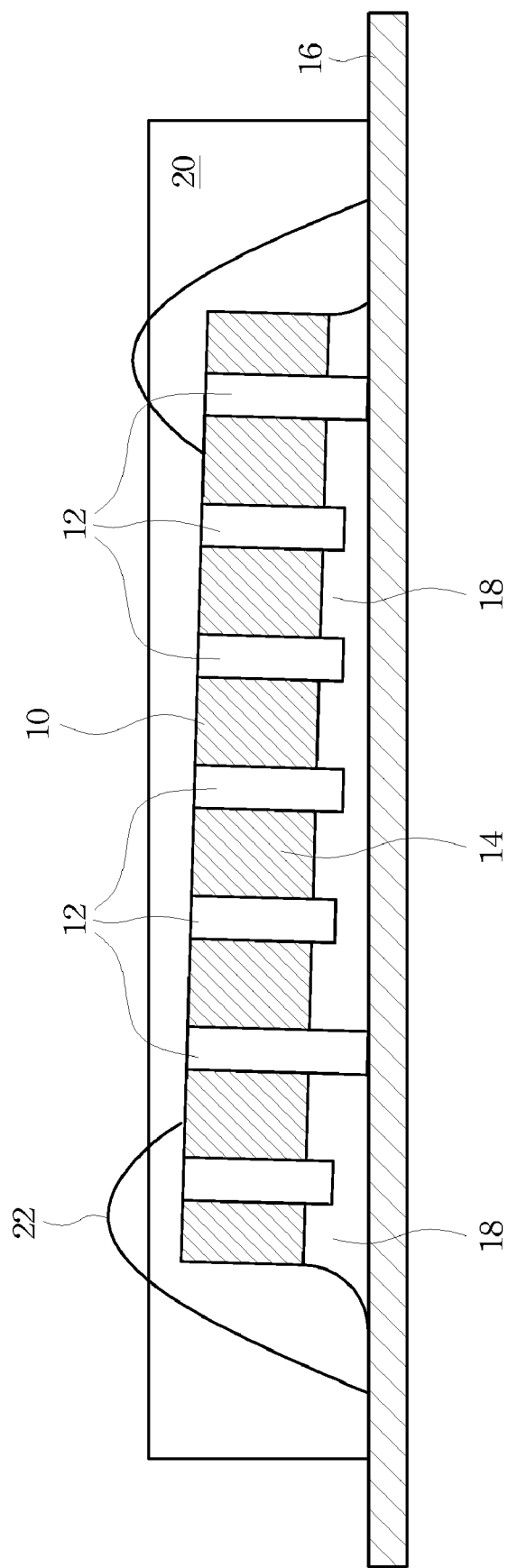
Figure 4A:
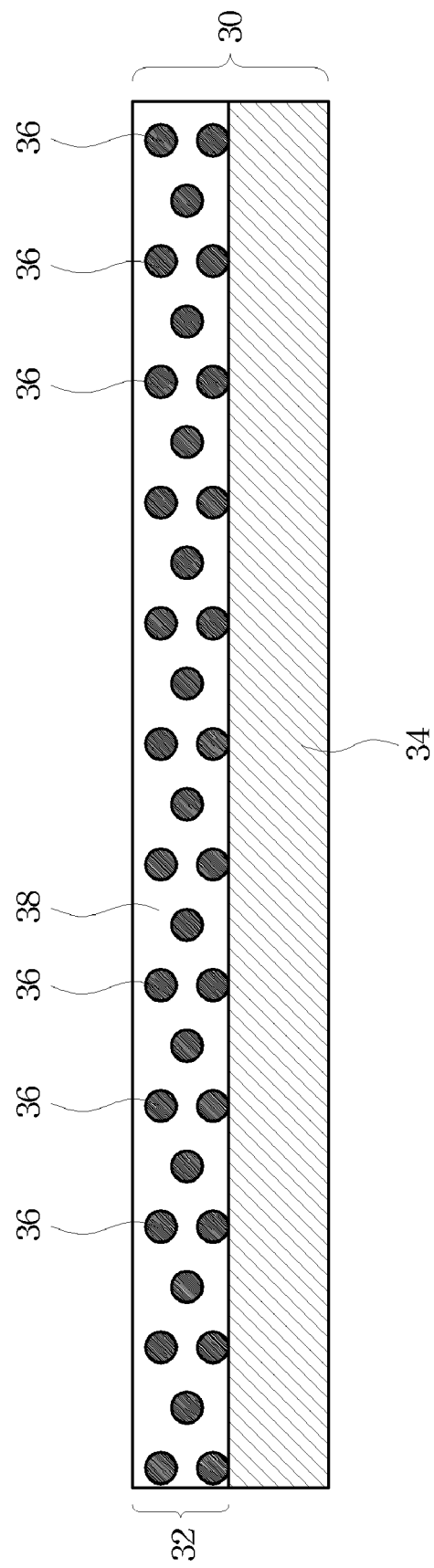
FIGS. 4 through 8 are cross-sectional views of intermediate stages in the manufacturing of an embodiment of the present invention.

FIG. 4A illustrates integrated wafer-mount tape 30, which includes anisotropic conducting film (ACF) 32 and ultraviolet (UV) wafer-mount tape 34. As is known in the art, ACF 32 includes a plurality of conductive particles 36 insulated from each other by non-conductive base material 38, which may include epoxies. Each of the conductive particles 36 may be polymer spheres coated with conductive materials, for example, nickel and gold. The insulated conductive particles 36 are distributed in such a way that their incidental contacts are low. Accordingly, conductive particles 36 may be embedded in base material 38 in the form of matrixes. In an exemplary embodiment, ACF 32 has a thickness of between about 25 μm and about 75 μm. The thickness of ACF 32 needs to be greater than the lengths of the protruded portions of TSVs 46 (refer to FIG. 7A). The details are discussed in subsequent paragraphs.

Figure 4B:
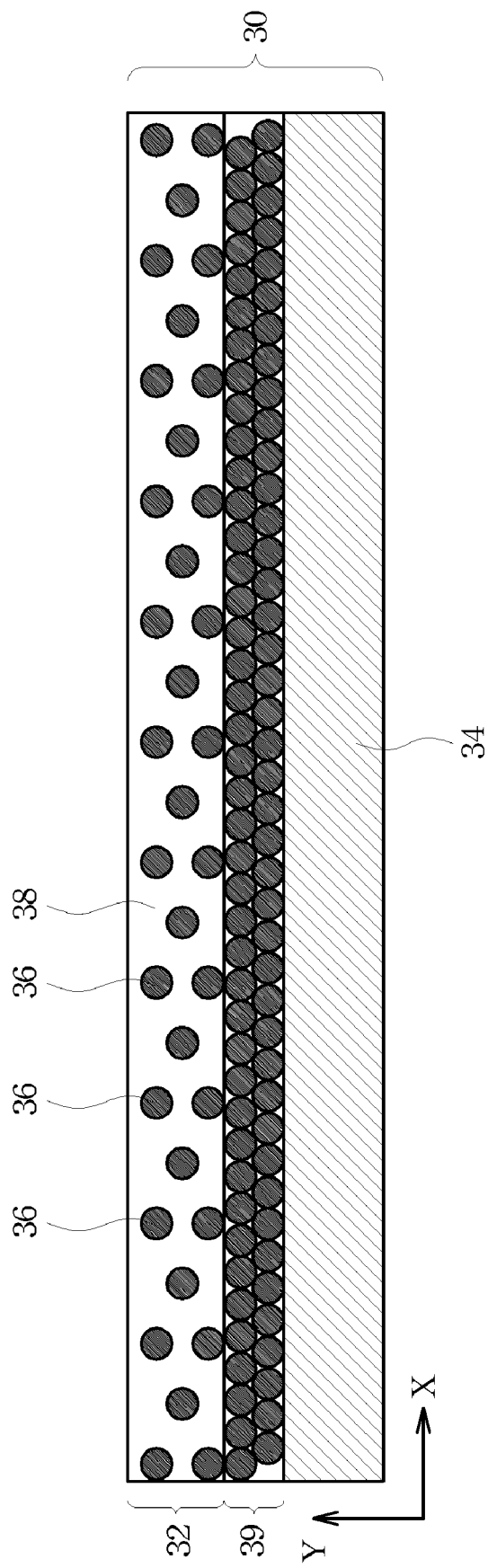

UV wafer-mount tape 34 is adhesive, and may lose its adhesive characteristic when exposed to UV light. In an embodiment, ACF 32 and UV wafer-mount tape 34 are in contact with each other, as is shown in FIG. 4A. In alternative embodiment, as is shown in FIG. 4B, a conductive layer 39, which is preferably flexible, may be formed between ACF 32 and UV wafer-mount tape 34. In an exemplary embodiment, conductive layer 39 is formed of similar materials as ACF 32, except the density of the conductive particles are significantly higher than in ACF 32, so that conductive layer 39 is conductive not only in the Y-direction, but also in the X-direction. Conductive layer 39 may also be formed of other materials, such as nickel, gold, and the like.

Figure 5:
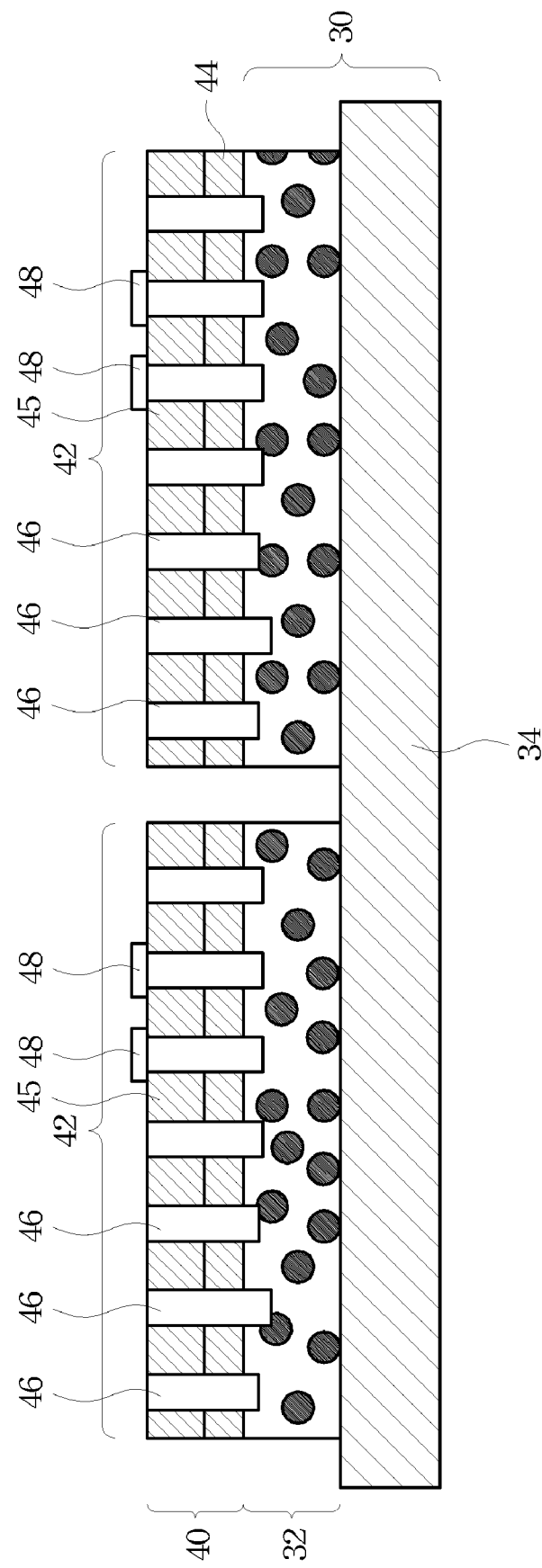

Referring to FIG. 5, wafer 40 is attached to integrated wafer-mount tape 30, with ACF 32 in contact with the backside of wafer 40. Wafer 40 includes a plurality of dies 42, each including substrate 44 and a plurality of through-silicon vias (TSV) 46. Dies 42 may further include semiconductor substrates 44, and integrated circuits formed at the front surfaces of semiconductor substrates 44. Transistors 45 are schematically illustrated to symbolize the integrated circuits (not shown). Interconnect structures, which include metal lines and vias formed in low-k dielectric layers (not shown), are formed over, and interconnecting, the integrated circuits. TSV 46 may be connected to the integrated circuits in dies 42. In an embodiment, bond pads 48 are formed on the front surface of dies 42, wherein bond pads 48 are used for connecting dies 42 to package substrates, or other dies that will be stacked on dies 42.

As is known in the art, the formation of TSVs 46 include forming via openings extending from substantially the front surface of wafer 40 into semiconductor substrate 44, and filling the openings with a conductive material, for example, copper or copper alloys. The back surface of wafer 40 is then polished to expose TSVs 46. Due to process variations, TSVs 46 may have different lengths, and thus may protrude out of the back surface of die 42 for different lengths.

When wafer 40 is attached to integrated wafer-mount tape 30, appropriate force is applied so that the protruding portions of TSVs 46 may penetrate, at least partially, into ACF 32. Wafer 40 is then sawed along the scribe lines to separate dies 42. Preferably, the kerfs extend into ACF 32, and hence ACF 32 is separated into die-size pieces also.

Figure 6:
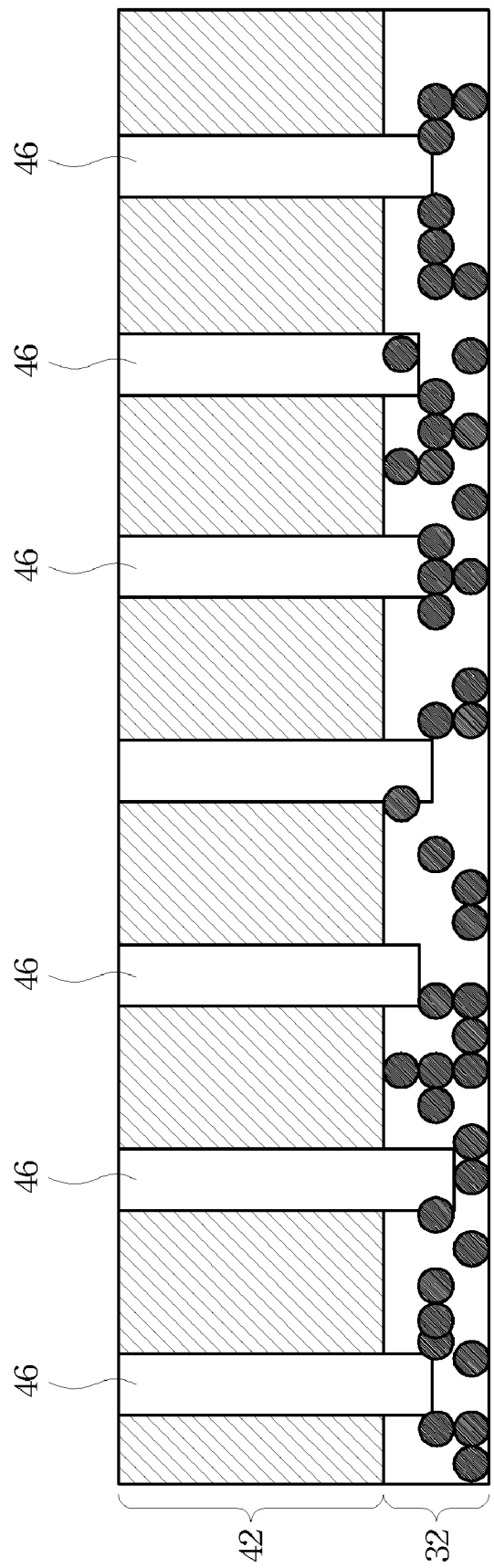

UV wafer-mount tape 34 is then exposed to UV light, and hence becoming non-adhesive. Dies 42 may thus be detached from UV wafer-mount tape 34. In the resulting structure, as is shown in FIG. 6, the backside of each of dies 42 is attached to one piece of ACF 32.

Figure 7A:
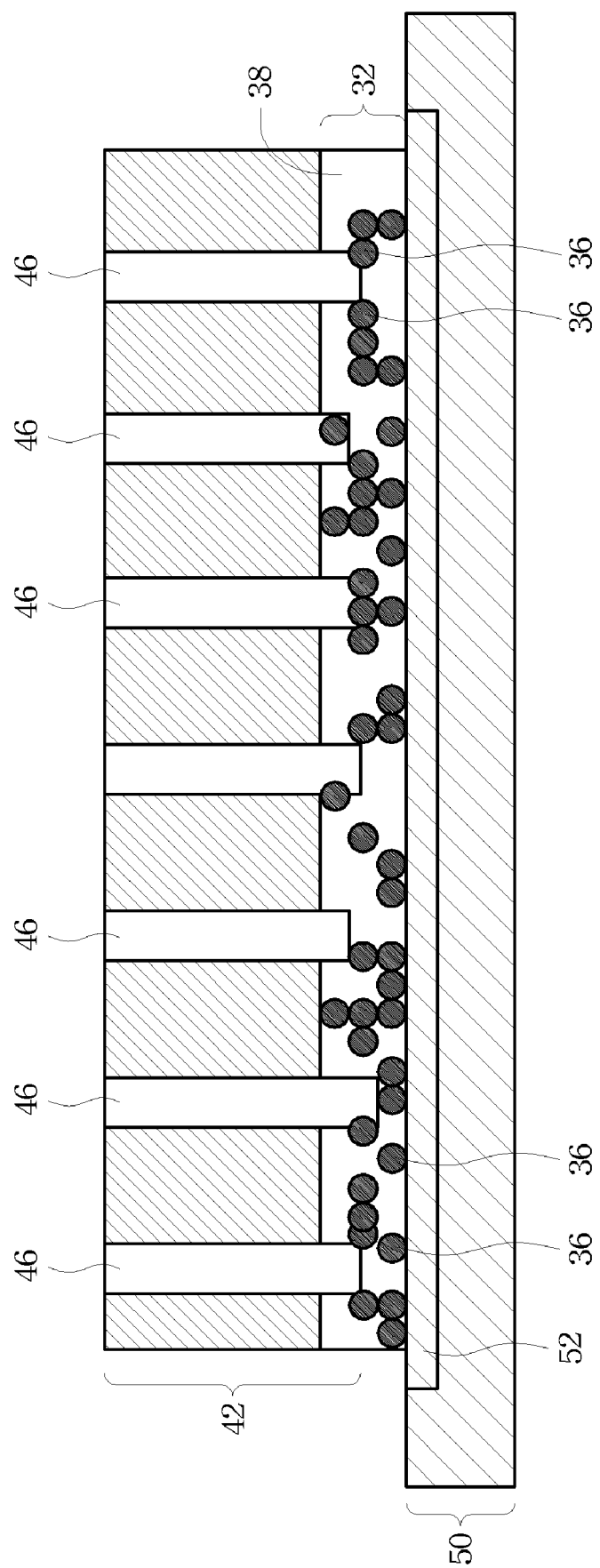

FIG. 7A illustrates the mounting of die 42 on package substrate 50. Package substrate 50 may be a bismaleimide trianzine (BT) substrate, a print circuit board (PCB), or other commonly used substrate capable of having dies packaged thereon. Alternatively, package substrate 50 is a lead-frame. Bond pads or metal leads (not shown) may be formed on the surface of package substrate, and in contact with ACF 32. In the embodiments TSVs 46 are used for grounding purpose, package substrate 50 may include a conductive layer 52 on the surface for shorting TSVs 46.

The structure as shown in FIG. 7A is then subject to pressure and heat to cure the base material 38 and to securely attach ACF 32 onto package substrate 50. Under the pressure, conductive particles 36 are trapped, while insulating material 38 is pushed away, allowing TSVs 46 to electrically connect to package substrate 50 through conductive particles 36. In an exemplary embodiment, the curing temperature is between about 150° C. and about 210°, while the desirable pressure depends on the number of TSVs 46. In the resulting structure, TSVs 46 are shorted to each other and to the ground through conductive layer 52.

Figure 7B:
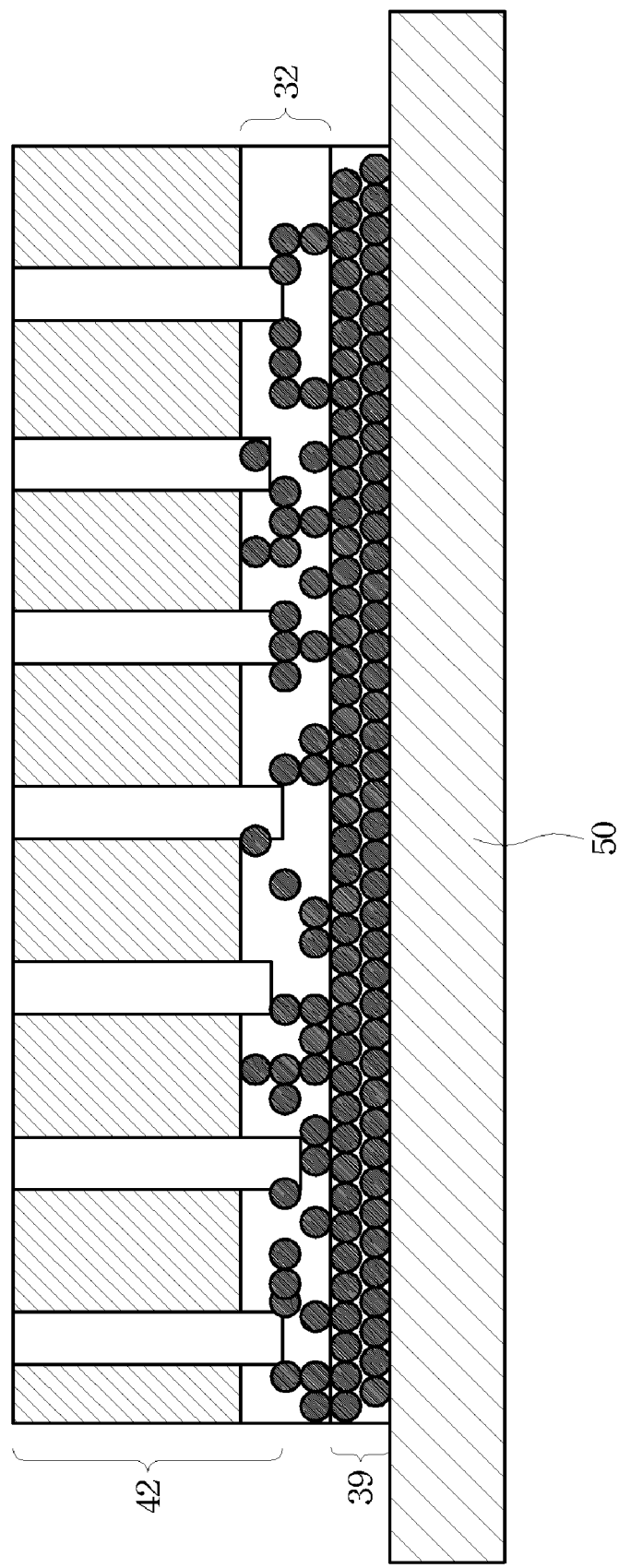

In alternative embodiments, as is shown in FIG. 7B, if the integrated wafer-mount tape 30 includes conductive layer 39, after UV wafer-mount tape 34 is removed, conductive layer 39 is left on ACF 32. As a result, TSVs 46 are shorted through conductive layer 39.

Figure 7C:
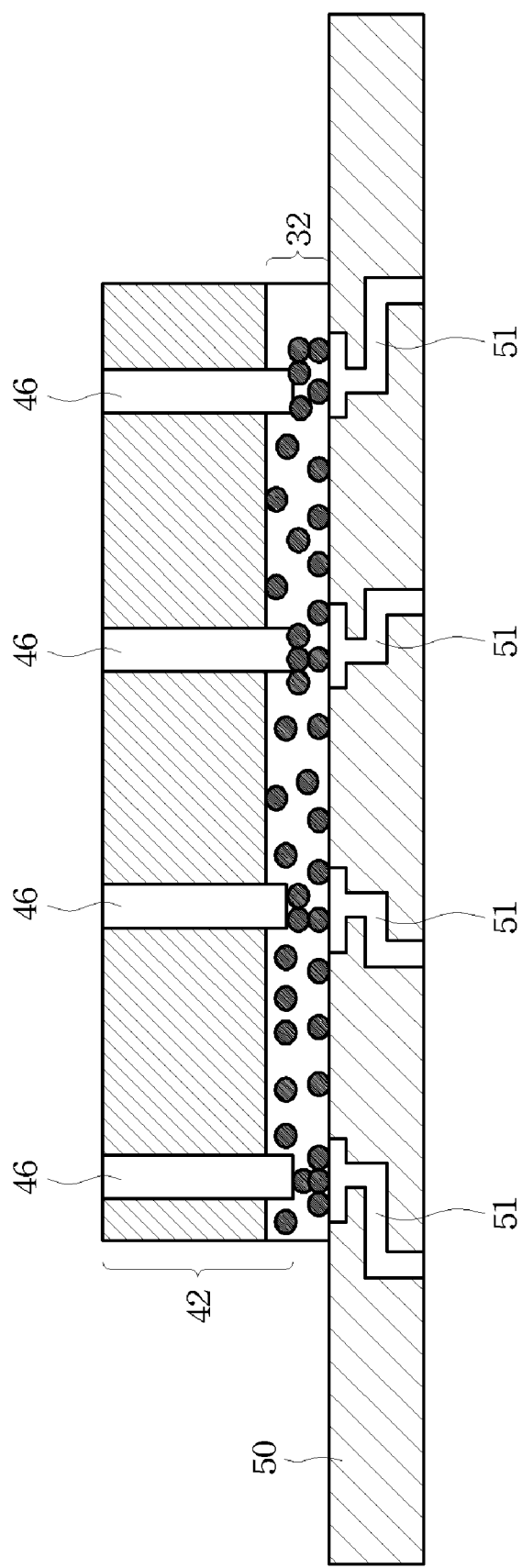

In yet other embodiments, as is shown in FIG. 7C, TSVs 46 are not used for grounding purpose. Accordingly, through ACF 32, TSVs 46 are connected to electrically-insulated bonding pads and redistribution traces 51 in package substrate 50.

Figure 8:
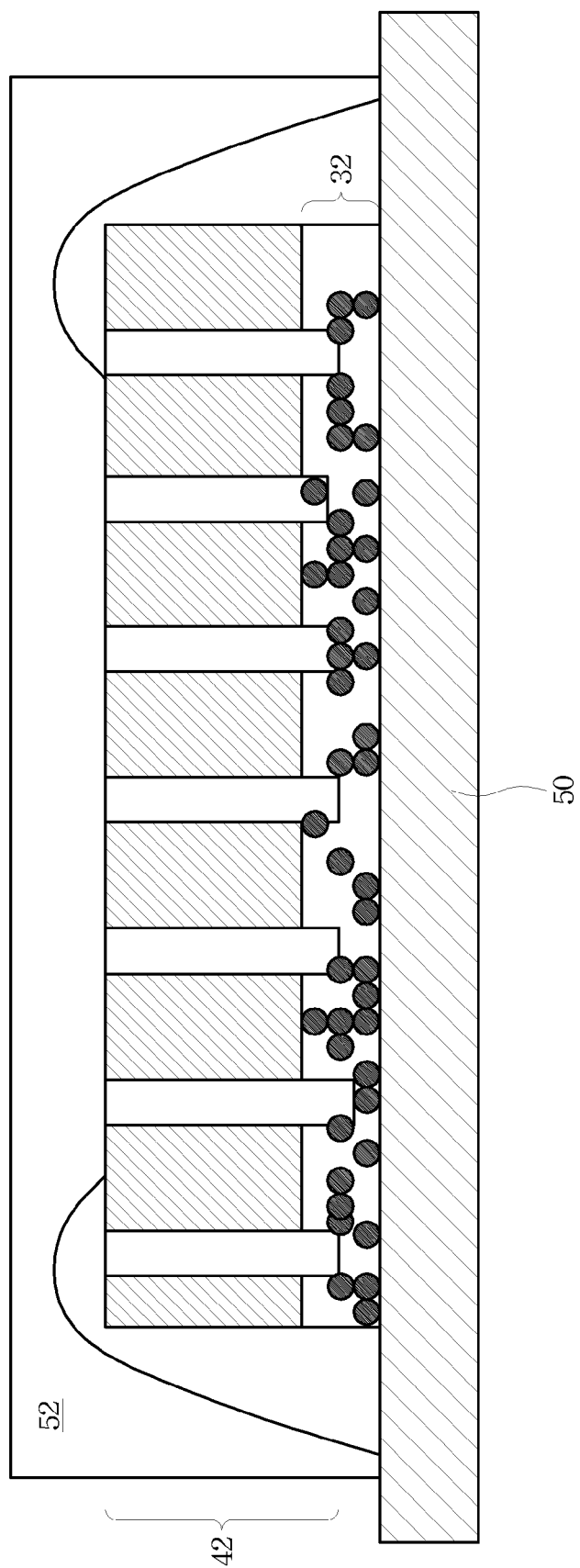

In FIG. 8, die 42 is electrically connected to package substrate 50 through wire bonding. Molding compound 52 is then formed to protect the resulting package substrate.

The embodiments of the present invention have several advantageous features. First, with ACF 32, the difference in the lengths of TSV 46 is absorbed by ACF 32. As a result, die 42 is parallel to package substrate 50. The likelihood that some portions of the resulting package are exposed through the molding compound is thus reduced.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for forming a package structure, the method comprising:
   providing a die comprising:
   a front surface;

a back surface on an opposite side of the front surface; and a through-silicon via (TSV) exposed through the back surface of the die, an exposed portion of the TSV having a same width as an unexposed portion of the TSV; and attaching an anisotropic conducting film (ACF) to the back surface of the die, wherein the TSV penetrates into the ACF.

2. The method of claim 1, where the step of attaching the ACF comprises:

providing an integrated wafer-mount tape comprising:
 a ultra-violet wafer-mount tape; and
 the ACF on an opposite side of the integrated wafer-mount tape than the ultra-violet wafer-mount tape;

attaching a semiconductor wafer to the integrated wafer-mount tape, wherein the die is a portion of the wafer, and wherein a back surface of the wafer is in contact with the ACF;

sawing the semiconductor wafer into separate dies in the semiconductor wafer;

exposing the ultra-violet wafer-mount tape to an ultra-violet light; and detaching the ultra-violet wafer-mount tape from the ACF.

3. The method of claim 1, where the step of providing the die comprises:

providing a wafer comprising the die, wherein the die comprises a plurality of TSVs; and polishing a backside of the wafer to expose the plurality of TSVs.

4. The method of claim 3 further comprising mounting the die and the ACF onto a package substrate, wherein the plurality of TSVs comprises at least two TSVs with different lengths, and wherein after the step of mounting, a back surface of the die is substantially parallel to a surface of the package substrate.

5. The method of claim 1 further comprising mounting the die and the ACF onto a package substrate, the ACF being between the die and the package substrate.

6. The method of claim 1 further comprising attaching a flexible conductive layer to the ACF.

7. The method of claim 6 further comprising mounting the die, the ACF, and the flexible conductive layer onto a package substrate, the ACF and the flexible conductive layer being disposed between the die and the package substrate.

8. A method of forming a package structure, the method comprising:

providing an integrated wafer-mount tape comprising:
 a ultra-violet wafer-mount tape; and
 an anisotropic conducting film (ACF) on an opposite side of the integrated wafer-mount tape than the ultra-violet wafer-mount tape;

attaching a semiconductor wafer to the integrated wafer-mount tape, wherein a back surface of the wafer is in contact with the ACF;

sawing the semiconductor wafer to separate dies in the semiconductor wafer;

exposing the ultra-violet wafer-mount tape to an ultra-violet light;

detaching the ultra-violet wafer-mount tape from the ACF; and mounting a die separated from the semiconductor wafer onto a package substrate, wherein the ACF is between the die and the package substrate.

9. The method of claim 8, wherein the die comprises a through-silicon via (TSV) protruding out of a back surface of the die, and wherein in the step of mounting the die, the TSV penetrating into the ACF.

10. The method of claim 9, wherein the die comprises a plurality of TSVs, wherein at least two of the TSVs protrude out of the back surface of the die for different lengths.

11. The method of claim 8, wherein during the step of sawing the semiconductor wafer, kerfs extend into the ACF.

12. The method of claim 8, wherein the integrated wafer-mount tape further comprises a conductive layer between the package substrate and the ACF, and wherein after the step of detaching the ultra-violet wafer-mount tape from the ACF, the conductive layer is attached to the ACF.

13. A method of forming a package structure, the method comprising:

attaching a wafer-mount tape to a wafer, the wafer comprising a plurality of dies, and the wafer-mount tape comprising an anisotropic conducting film (ACF);

separating the plurality of dies; and attaching a die and a portion of the wafer-mount tape to a package substrate, the die being separated from the plurality of dies, and the die comprising a first through substrate via (TSV) protruding from a surface of the die and penetrating the portion of the wafer-mount tape.

14. The method of claim 13, wherein the wafer-mount tape further comprises an ultra-violet wafer-mount tape, and wherein the separating the plurality of dies comprises exposing the ultra-violet wafer mount tape to ultra-violet light.

15. The method of claim 13, wherein the wafer-mount tape further comprises a flexible conductive layer.

16. The method of claim 15, wherein the wafer-mount tape is attached to the package substrate between the die and the package substrate, the ACF adjoining the die, and the flexible conductive layer adjoining the package substrate.

17. The method of claim 13, wherein separating the plurality of dies comprises sawing the wafer, wherein kerfs extend into the wafer-mount tape.

18. The method of claim 13, wherein the first TSV penetrates the ACF.

19. The method of claim 13 further comprising providing the wafer, the providing comprising polishing the wafer to expose the first TSV and a second TSV on the die, the first TSV and the second TSV protruding from the surface of the die.

20. The method of claim 19, wherein a first exposed portion of the first TSV and a second exposed portion of the second TSV protrude from the surface of the die by different lengths.

* * * * *